(12) United States Patent
Akre

(10) Patent No.: US 9,001,524 B1
(45) Date of Patent: Apr. 7, 2015

(54) SWITCH-MODE POWER CONVERSION IC PACKAGE WITH WRAP-AROUND MAGNETIC STRUCTURE

(75) Inventor: Sunil M. Akre, Cupertino, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 248 days.

(21) Appl. No.: 13/195,318

(22) Filed: Aug. 1, 2011

(51) Int. Cl.
| | |
|---|---|
| *H05K 7/20* | (2006.01) |
| *H01L 21/60* | (2006.01) |
| *H01F 5/00* | (2006.01) |
| *H01F 27/02* | (2006.01) |
| *H01L 23/64* | (2006.01) |
| *H01F 27/36* | (2006.01) |

(52) U.S. Cl.
CPC ............ *H01F 27/027* (2013.01); *H01L 23/645* (2013.01); *H05K 7/209* (2013.01); *H01F 27/365* (2013.01)

(58) Field of Classification Search
CPC ..... H05K 7/209; H01F 27/027; H01F 27/365; H01F 2027/2814; H01L 23/49575; H01L 23/645
USPC ........... 361/807, 813; 257/670, 686, 777, 784
See application file for complete search history.

(56) References Cited

U.S. PATENT DOCUMENTS

| | | | | |
|---|---|---|---|---|
| 3,621,307 | A * | 11/1971 | Raven et al. | 327/517 |
| 6,930,584 | B2 * | 8/2005 | Edo et al. | 336/200 |
| 7,723,129 | B2 * | 5/2010 | Koduri | 438/3 |
| 7,940,531 | B2 * | 5/2011 | Watanabe | 361/760 |
| 2007/0075815 | A1 * | 4/2007 | Lotfi et al. | 336/200 |
| 2009/0057822 | A1 * | 3/2009 | Wen et al. | 257/531 |
| 2009/0115037 | A1 * | 5/2009 | How et al. | 257/675 |
| 2009/0134503 | A1 * | 5/2009 | Feng et al. | 257/673 |
| 2010/0102416 | A1 * | 4/2010 | Ashrafzadeh et al. | 257/531 |

OTHER PUBLICATIONS

Presented by Michele, Advisors, Prof K.D. T. Ngo, Prof. J. D. Van Wyk; Substrate vs. Co-packaged Inductor; Feb. 13, 2008; pp. 1-36.
Luca Daniel, Charles R. Sullivan, Seth R. Sanders; Design of Microfabricated Inductors; 1996; pp. 1447-1455; University of California, Berkeley, Department of Electrical Engineering and Computer Sciences, Berkeley, CA.
T. Liakopoulos, R. Filas, M. Wilkowski, A. Lotfi; Power Supply Chip Includes Thin Film Power Inductor; 2005; pp. 1-4; Switching Power Magazine.
Mingliang Wang, Khai D.T. Ngo, Issa Batarseh, Huikai Xie; Integrated Power Inductor with Silicon Substrate Molding; pp. 1-4; Department of Electrical and Computer Engineering, University of Florida and Department of Electrical and Computer Engineering, University of Central Florida.

(Continued)

*Primary Examiner* — Anatoly Vortman
*Assistant Examiner* — Jacob Crum
(74) *Attorney, Agent, or Firm* — Advent, LLP

(57) ABSTRACT

An integrated circuit device includes a support for supporting electrical circuitry, an integrated circuit having electrical circuitry disposed on the support, and a magnetic portion attached to the support around the integrated circuit. The integrated circuit and the magnetic portion are interconnected for converting a power input signal having a first characteristic to a power output signal having a second characteristic different from the first characteristic.

20 Claims, 9 Drawing Sheets

(56) References Cited

OTHER PUBLICATIONS

Zenchi Hayashi, Yasushi Katayama, Masaharu Edo, Haruhiko Nishio; High-Efficiency DC-DC Converter Chip Size Module with Integrated Soft Ferrite; Sep. 2003; pp. 3068-3072; IEEE Transactions on Magnetics; vol. 39, No. 5.

Jin-Woo Park, Jae Yeong Park, Yeun-Ho Joung, Mark G. Allen; Fabrication of High Current and Low Profile Micromachined Inductor with Laminated Ni/Fe Core; Mar. 2002; pp. 106-111; IEEE Transactions on Components and Packaging Technologies; vol. 25, No. 1.

* cited by examiner

US 9,001,524 B1

SWITCH-MODE POWER CONVERSION IC PACKAGE WITH WRAP-AROUND MAGNETIC STRUCTURE

BACKGROUND

Power converters are used to convert electrical energy (e.g., converting Alternating Current (AC) to or from Direct Current (DC), changing voltage or frequency, or some combination thereof). In some applications, power conversion is provided by small electrical modules connected to a circuit board, generally including power conversion circuitry and an associated magnetic structure, such as an inductor. For example, in a side-by-side configuration, a power-Integrated Circuit (power-IC) chip is placed alongside an inductor on a circuit board. In another type of configuration, a power-IC is stacked on top of an inductor. In these configurations, the inductor modules are typically off-the-shelf components, or are realized using a ferrite/silicon substrate. Because of space or process constraints, a relatively small inductance value is achieved in these configurations, necessitating high switching frequencies that provide non-optimum performance. Further, heat generated by the power conversion process is typically conducted to the circuit board, which may be an undesirable thermal management solution. Moreover, stacking a power-IC on the top or bottom of a magnetic component may degrade the thermal or electrical performance of the system.

SUMMARY

An integrated circuit device is disclosed that includes a support for supporting electrical circuitry, an integrated circuit having electrical circuitry disposed of the support, and a magnetic portion attached to the support around the integrated circuit. The integrated circuit and the magnetic portion are interconnected for converting a power input signal having a first characteristic to a power output signal having a second characteristic different from the first characteristic.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

Figure 6:
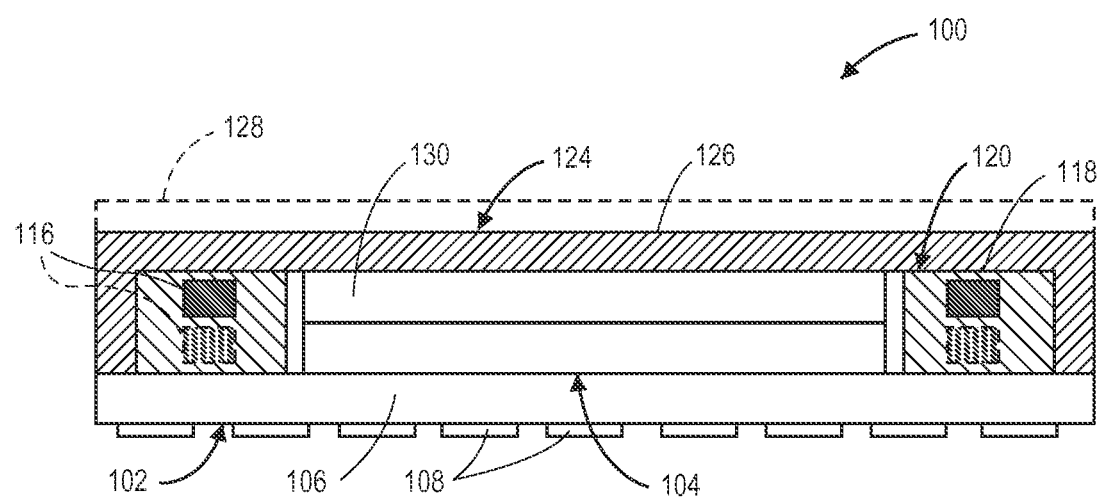

FIG. 6 is a diagrammatic partial cross-sectional side elevation view illustrating an integrated circuit device including a support, an integrated circuit, a magnetic portion wrapped around the integrated circuit, and an encapsulating structure, where the support is implemented as a substrate for supporting the integrated circuit and the magnetic portion in accordance with an example implementation of the present disclosure.

Figure 7:
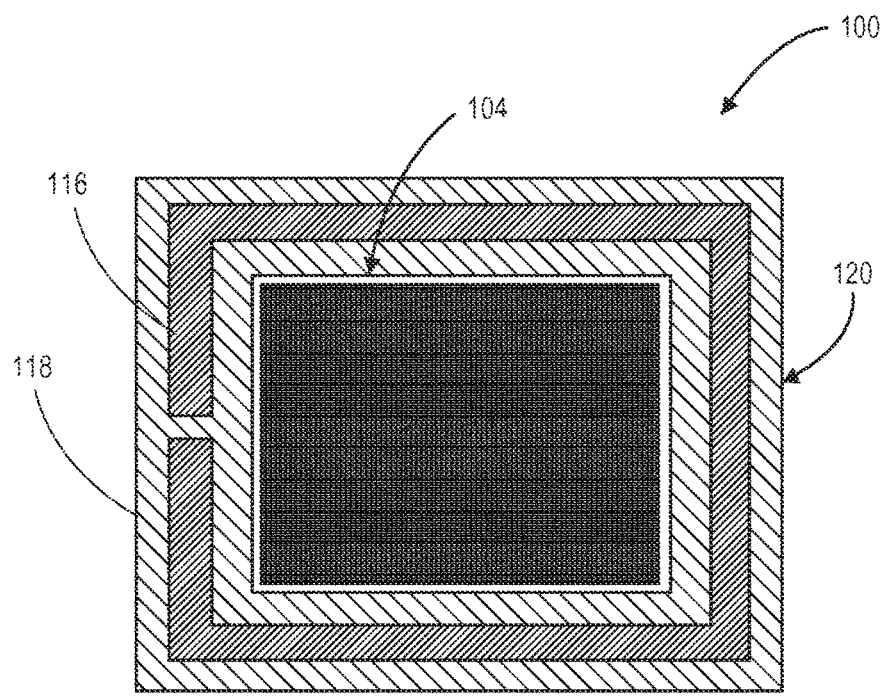

FIG. 7 is a diagrammatic partial top plan view of the integrated circuit device illustrated in FIG. 6, where the encapsulating structure has been removed for illustration purposes.

Figure 8:
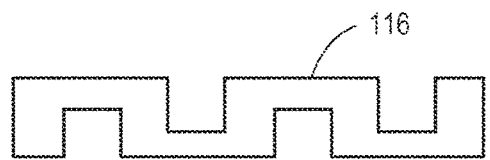

FIG. 8 is a diagrammatic partial view of a winding for a magnetic portion of an integrated circuit device in accordance with an example implementation of the present disclosure.

Figure 9:
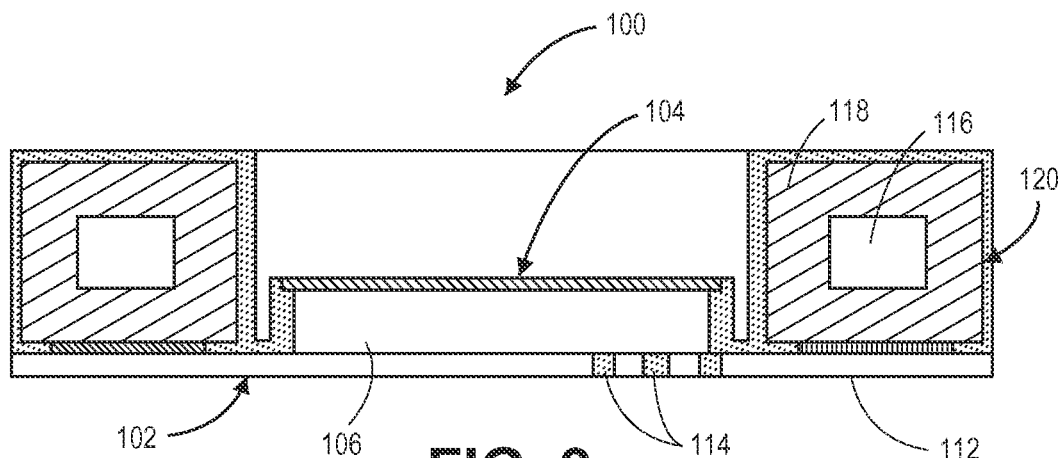

FIG. 9 is a diagrammatic partial cross-sectional side elevation view illustrating an integrated circuit device including a support, an integrated circuit, and a magnetic portion wrapped around the integrated circuit, where the integrated circuit device includes a partial shield/heat sink and lead-frame support.

Figure 10:
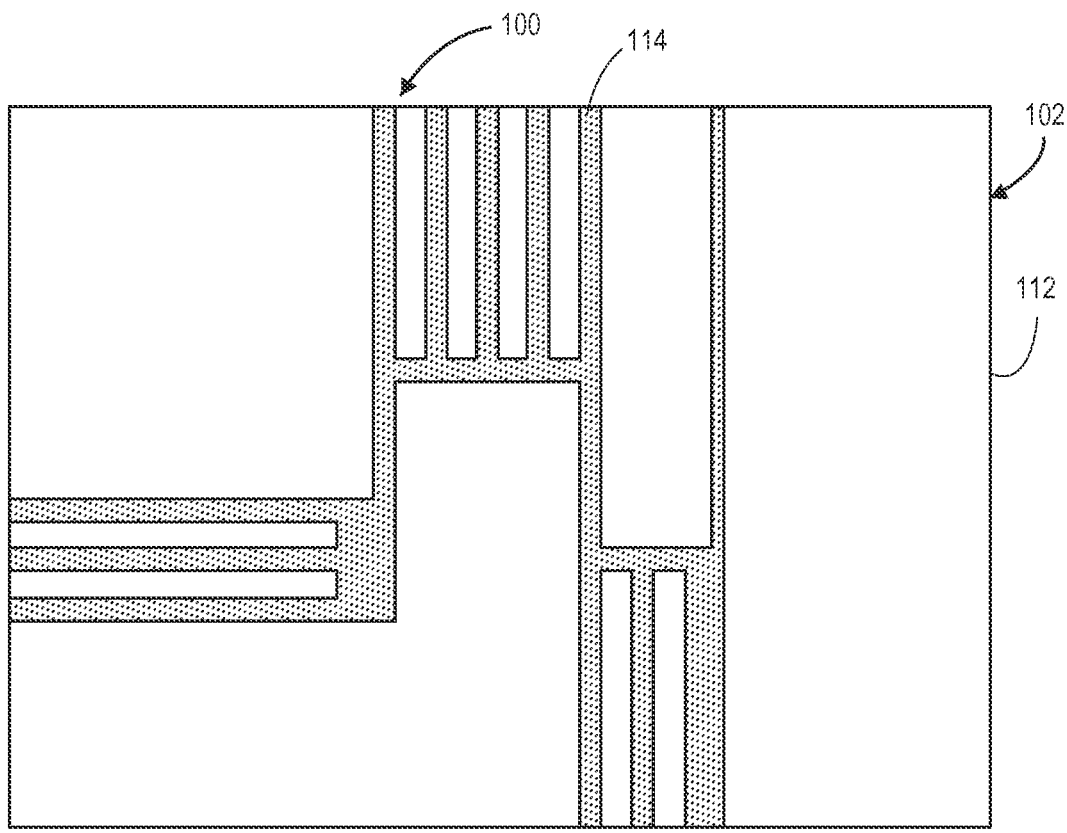

FIG. 10 is a diagrammatic bottom plan view of the integrated circuit device illustrated in FIG. 9.

Figure 11:
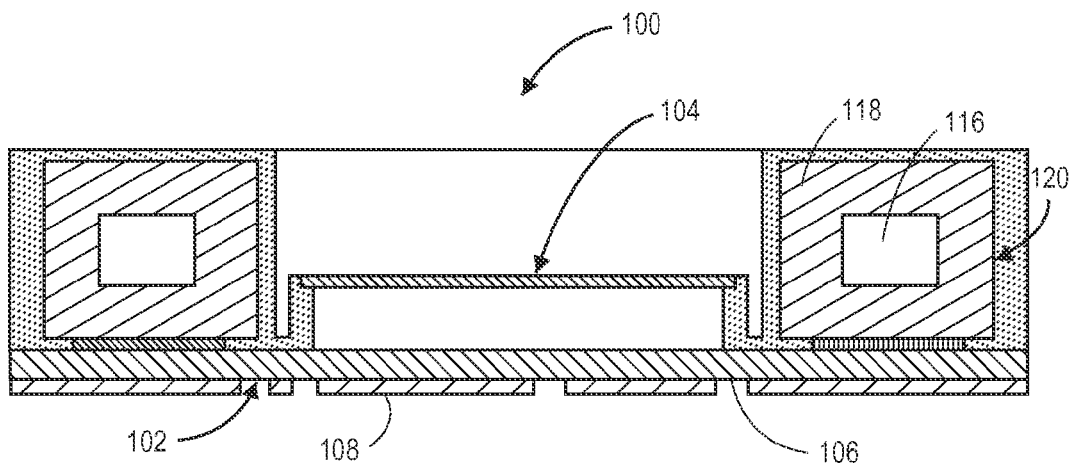

FIG. 11 is a diagrammatic partial cross-sectional side elevation view illustrating an integrated circuit device including a support, an integrated circuit, and a magnetic portion wrapped around the integrated circuit, where the integrated circuit device includes a partial shield/heat sink and substrate support.

Figure 12:
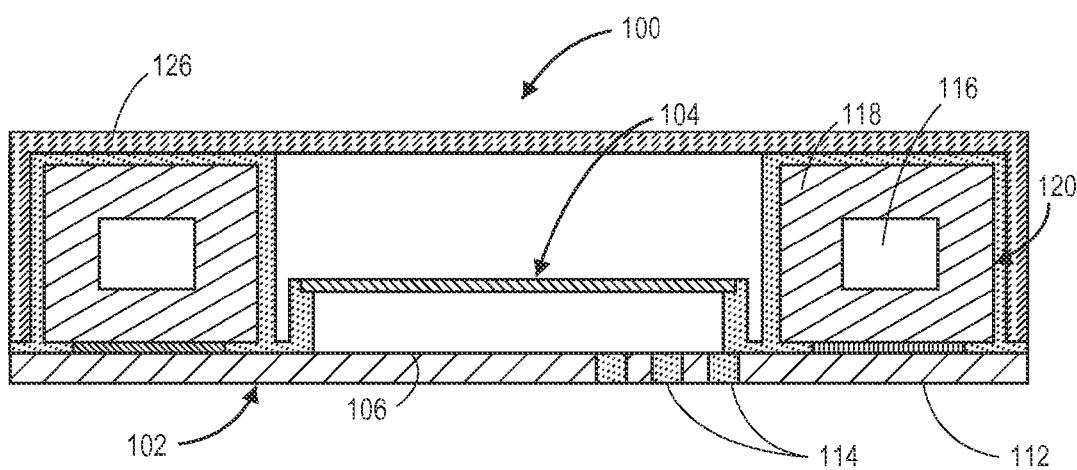

FIG. 12 is a diagrammatic partial cross-sectional side elevation view illustrating an integrated circuit device including a support, an integrated circuit, a magnetic portion wrapped around the integrated circuit, and an encapsulating structure, where the integrated circuit device includes a full shield/heat sink and lead-frame support.

Figure 13:
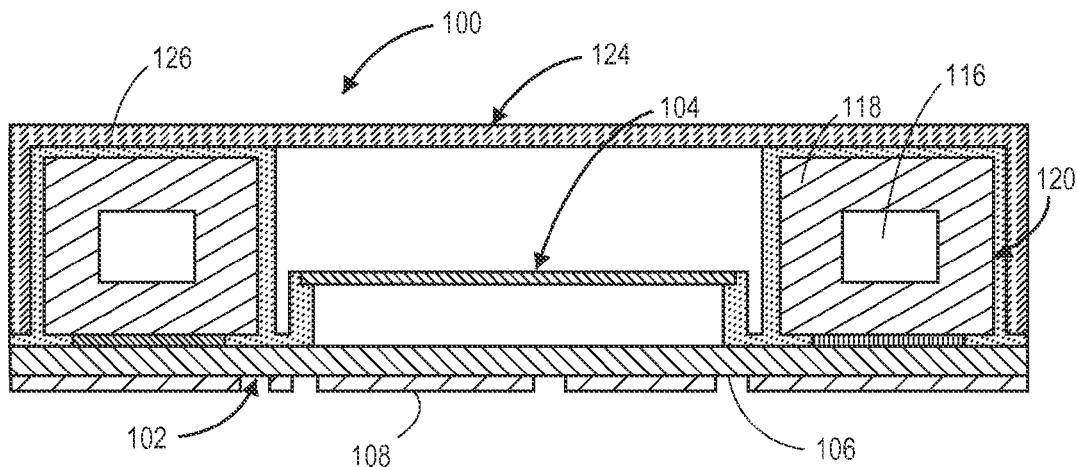

FIG. 13 is a diagrammatic partial cross-sectional side elevation view illustrating an integrated circuit device including a support, an integrated circuit, a magnetic portion wrapped around the integrated circuit, and an encapsulating structure, where the integrated circuit device includes a full shield/heat sink and substrate support.

Figure 14:
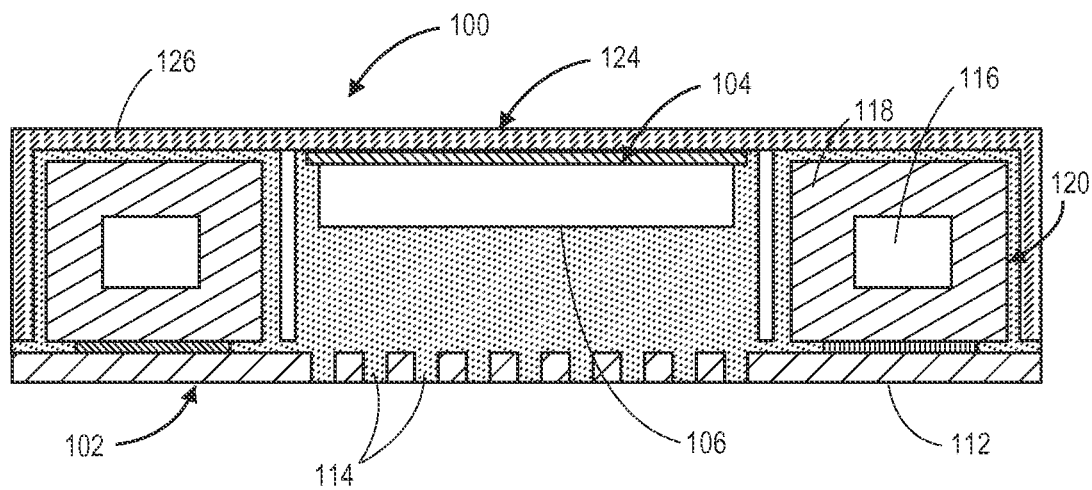

FIG. 14 is a diagrammatic partial cross-sectional side elevation view illustrating an integrated circuit device including a support, an integrated circuit, a magnetic portion wrapped around the integrated circuit, and an encapsulating structure, where the integrated circuit device includes a full shield/heat sink and lead-frame support, and where power-IC circuitry is raised from the support.

Figure 15:
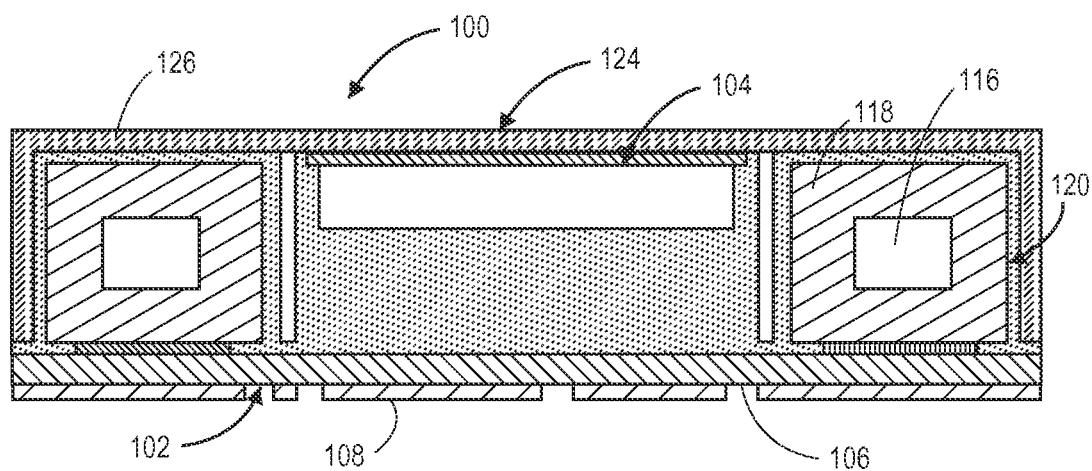

FIG. 15 is a diagrammatic partial cross-sectional side elevation view illustrating an integrated circuit device including a support, an integrated circuit, a magnetic portion wrapped around the integrated circuit, and an encapsulating structure, where the integrated circuit device includes a full shield/heat sink and substrate support, and where power-IC circuitry is raised from the support.

Figure 16:
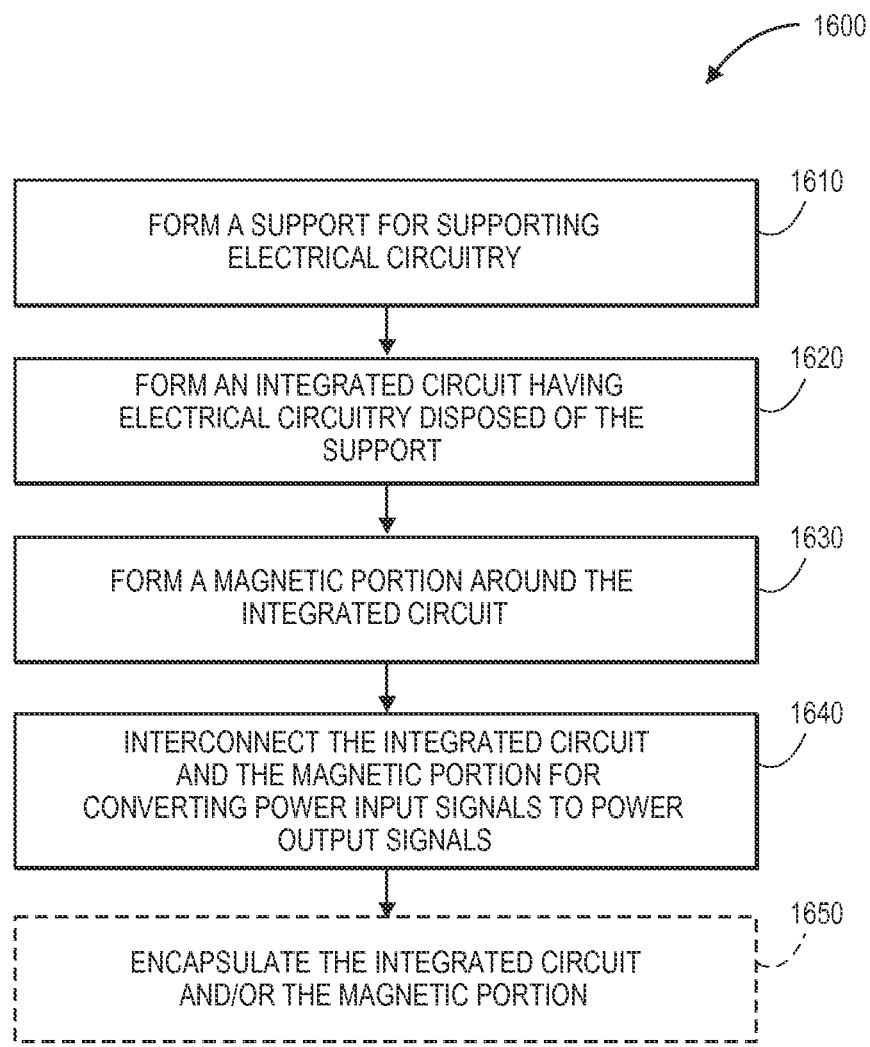

FIG. 16 is a flow diagram illustrating a method of forming an integrated circuit device in accordance with an example implementation of the present disclosure.

DETAILED DESCRIPTION

Overview

An integrated circuit device is described that includes circuitry and associated magnetic structure for providing switch-mode power conversion in an Integrated Circuit (IC)

package. The configuration of the circuitry and the magnetic structure can provide enhanced electrical and/or thermal performance, which may reduce heating of a circuit board to which the electrical circuitry is connected, free the circuit board design from routing limitations, and minimize the Electro-Magnetic Interference (EMI) impact of the power conversion circuitry. Further, the converter can be super-optimized in the IC and repeated design efforts can be eliminated. Also, the operating frequency can be lower than that achievable with other converter packages having similar size characteristics, leading to reduced switching losses in the converter. The power conversion and control architecture can be monolithic or separated into multi-chip solutions for better time to market. Further, this type of packaging concept can provide flexibility for adapting next generation power devices and/or control architectures. In implementations, the integrated circuit devices can be implemented as Power-SiP-Modules, and may include circuitry configured for Point of Load (POL) DC-DC power conversion, High-Brightness Light-Emitting Diode (HB-LED) drivers, and/or Intermediate Bus Converters (IBC)/Power-over-Ethernet (POE) converters.

The integrated circuit device includes a support for supporting electrical circuitry, an integrated circuit having electrical circuitry disposed on the support, and a magnetic portion attached to the support around the integrated circuit. The integrated circuit and the magnetic portion are interconnected for converting a power input signal having a first characteristic to a power output signal having a second characteristic different from the first characteristic. The integrated circuit device may include an encapsulating structure for at least partially encapsulating the integrated circuit and/or the magnetic portion. The encapsulating structure may be configured for shielding the integrated circuit and/or the magnetic portion. The encapsulating structure may include a thermal interface for transferring heat away from the integrated circuit and/or the magnetic portion. The integrated circuit device may also include a heat-sink thermally coupled with the encapsulating structure. In some instances, the encapsulating structure may be implemented as a lead-frame, and the integrated circuit may include electrical circuitry on a die attached to the lead-frame. The integrated circuit may be elevated relative to a bottom surface of the support, and may include copper towers for connecting the integrated circuit to a circuit board, or the like.

Example Implementations

FIGS. 1 through 15 illustrate integrated circuit devices 100 in accordance with example implementations of the present disclosure. As shown, an integrated circuit device 100 includes a support 102 for supporting an integrated circuit 104. The support 102 may be formed using a substrate 106 fabricated from a wafer, such as a silicon wafer (e.g., p-type wafer, n-type wafer, or the like), that includes one or more integrated circuits formed therein. The integrated circuits may be formed using suitable semiconductor formation techniques, such as deposition, etching, annealing, photolithography, and so forth. Once formed, the integrated circuits are configured to provide functionality to the integrated circuit devices 100. In some configurations, the support 102 may be formed as a lead-frame 112 for attaching an integrated circuit 104 having electrical circuitry formed on one or more dies, such as substrate 106 (e.g., as previously described).

The integrated circuit device 100 includes one or more windings 116 at least partially surrounding the integrated circuit 104. The windings 116 are formed from conductive material wound around a core material 118 to form a wrap-around magnetic portion 120, such as for an inductor or a power transformer. In the case of an inductor, the windings 116 may include a single turn, while in the case of a transformer, two, three, or more than three windings 116 may be present. Thus, single or multiple windings can be used with the core material 118 to provide single-phase, multi-phase, or multiple output isolated, non-isolated switch-mode power conversion. In some implementations, windings can be embedded in the core material 118 (e.g., for an inductor, a transformer, or a coupled-choke inductor). In other implementations, windings can be over the core (e.g., for an inductor). In an implementation for power conversion with very high current, a single winding may be used. For example, a single winding can be used in power conversion implementations where the current ranges between about ten amps and thirty amps (10A-30A). In other implementations as a transformer, one primary winding may extend around four sides of the periphery of the integrated circuit 104, with individual secondary winding segments on each of the four sides connected in parallel. For example, the wrap-around magnetic portion 120 may comprise embedded secondary windings forming a four-to-one (4:1) transformer. However, specific numbers of windings and specific winding configurations are provided by way of example only and are not meant to be restrictive of the present disclosure. Thus, other numbers of windings and winding configurations may be provided in accordance with the present disclosure.

The windings 116 are connected to the integrated circuit 104 to provide power conversion functionality (i.e., to convert a power input signal to a power output signal, where the input and output signals have one or more varying characteristics, such as converting an AC signal to a DC signal). For example, in the case of a configuration using a lead-frame 112 (e.g., as illustrated in FIGS. 2 through 5, 9, 10, 12, and 14), the windings 116 may be connected to the integrated circuit 104 via terminals 122 connected to the lead-frame 112, providing low-resistance connectivity to the magnetic portion 120 and low interconnectivity losses between the magnetic portion 120 and the integrated circuit 104. In other instances, the windings 116 may be connected to the integrated circuit 104 via the substrate 106 (e.g., as illustrated in FIGS. 6, 7, 11, 13, and 15). In embodiments, the magnetic portion 120 can implement an inductor (e.g., a power-bead inductor), a coupled inductor (e.g., a coupled-choke inductor), or an isolated transformer (e.g., a flat-transformer). The integrated circuit 104 connected to the magnetic portion 120 can be implemented using "power+control" circuitry (e.g., in an implementation where the integrated circuit device 100 comprises a magnetic portion 120 connected directly to a substrate 106) or as a power-Integrated Circuit (power-IC) (e.g., in an implementation where the integrated circuit device 100 comprises a magnetic portion 120 connected to a lead-frame 112).

By positioning the windings 116 around the integrated circuit 104, a larger loop area may be provided for the magnetic components with a smaller overall volume for the integrated circuit device 100. Thus, a larger inductance may be provided with a low profile package volume. This more effective use of volume within the integrated circuit device 100 may help to reduce heat buildup within the area of the magnetic portion 120 (e.g., by spreading the windings 116 out over a larger, less concentrated area). It should be noted that different inductances for the magnetic portion 120 formed by the windings 116 and the core material 118 may be selected for various circuit applications. For example, different inductances may be selected for different frequencies of operation, different input/output voltages, and/or different current requirements. Further, the overall volume of the magnetic material may be dictated by required inductance and the peak operating current.

A particular magnetic material configuration may be selected for the windings 116 and the core material 118 based upon properties of the materials, including core area permeability and/or the length of the magnetic field generated by the winding. The windings 116 are formed from a conducting material, such as copper, aluminum, pewter, or another type of material to efficiently conduct electrical current. For example, the windings 116 can be formed using a winding pattern of single or parallel copper stamping, as illustrated in FIG. 8. The core material 118 may be formed from a material having "soft" magnetic properties (i.e., a material that can be magnetized but does not tend to stay magnetized), such as a ferrite ceramic material and/or a powder iron material. In some implementations, the windings 116 and the core material 118 forming the magnetic portion 120 can include multiple windings with low-temperature co-fired ceramics.

The integrated circuit device 100 may include an encapsulating structure 124. The encapsulating structure 124 can be used for separating the integrated circuit 104 and/or the magnetic portion 120 from other electronic components of the integrated circuit device 100. For example, the encapsulating structure 124 can be used to reduce electrical interference to the integrated circuit 104 and improve thermal performance of the integrated circuit device 100. In some implementations, the encapsulating structure 124 is formed using the support 102 (e.g., when the support 102 comprises a lead-frame 112, as illustrated in FIGS. 2 through 5), while in other implementations, the encapsulating structure 124 is formed as encapsulating material covering the integrated circuit 104 and/or the magnetic portion 120 (e.g., when the magnetic portion 120 is connected directly to substrate 106, as illustrated in FIGS. 6, 7, 13 and 15). In still further instances, the encapsulating structure 124 covering the integrated circuit 104 and/or the magnetic portion 120 can be used with a lead-frame 112 (e.g., as illustrated in FIGS. 12 and 14). The encapsulating structure 124 can be an encapsulating material comprising metal material, ceramic material, and/or plastic material. However, this list is provided by way of example only, and is not meant to be restrictive of the present disclosure. Thus, it will be appreciated that a wide variety of materials may be used with the encapsulating structure 124.

The encapsulating structure 124 may be used to provide electromagnetic/electrostatic shielding between the integrated circuit 104 and/or the magnetic portion 120 and other electronic components of the integrated circuit device 100. For example, in some implementations, the lead-frame 112 can be used to shield components of the integrated circuit device 100 from one another (e.g., as illustrated in FIGS. 2 through 5). In other implementations, a metal encapsulating material can be used to shield components of the integrated circuit device 100 from nearby circuitry (e.g., as illustrated in FIGS. 6, 12, and 13). In further implementations, encapsulating material can be used to shield components of the integrated circuit device 100 from one another, and from nearby circuitry (e.g., as illustrated in FIGS. 14 and 15).

Figure 1:
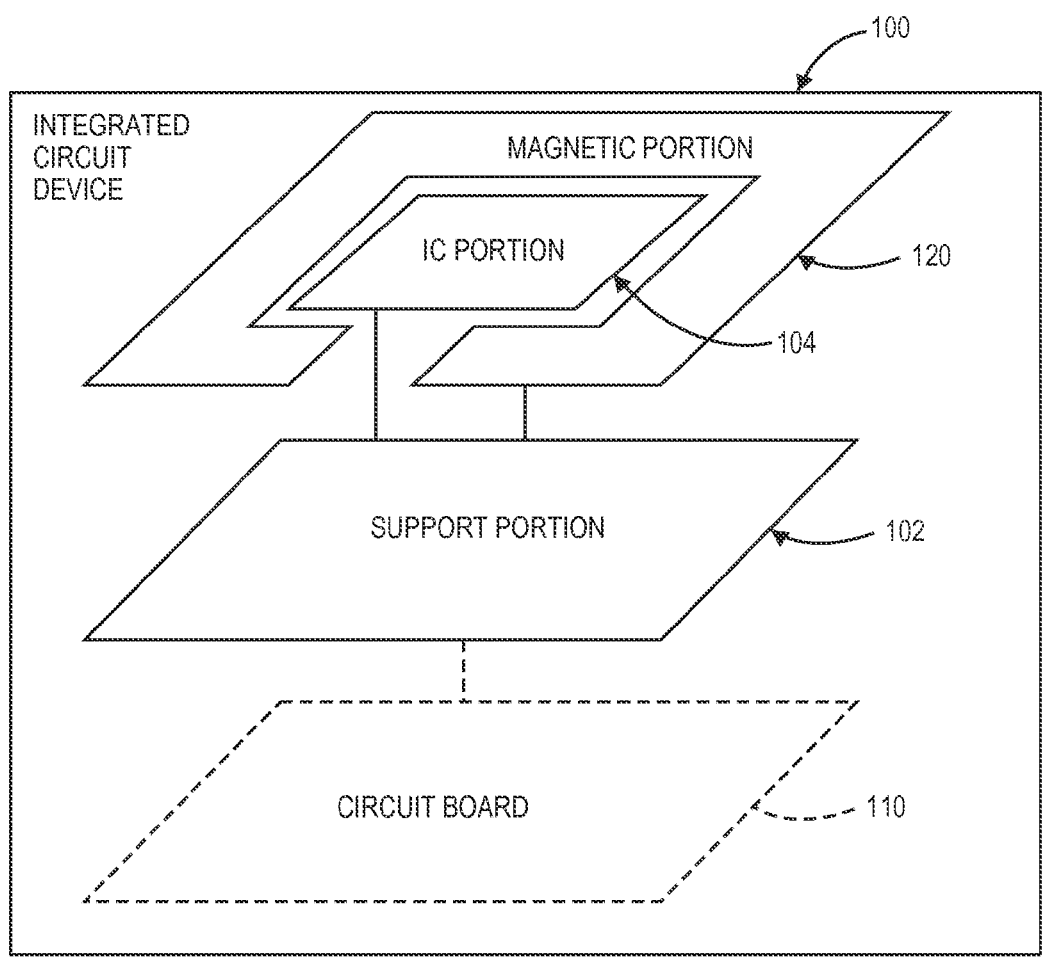
FIG. 1 is a block diagram illustrated an integrated circuit device in accordance with an example implementation of the present disclosure.
Figure 2:
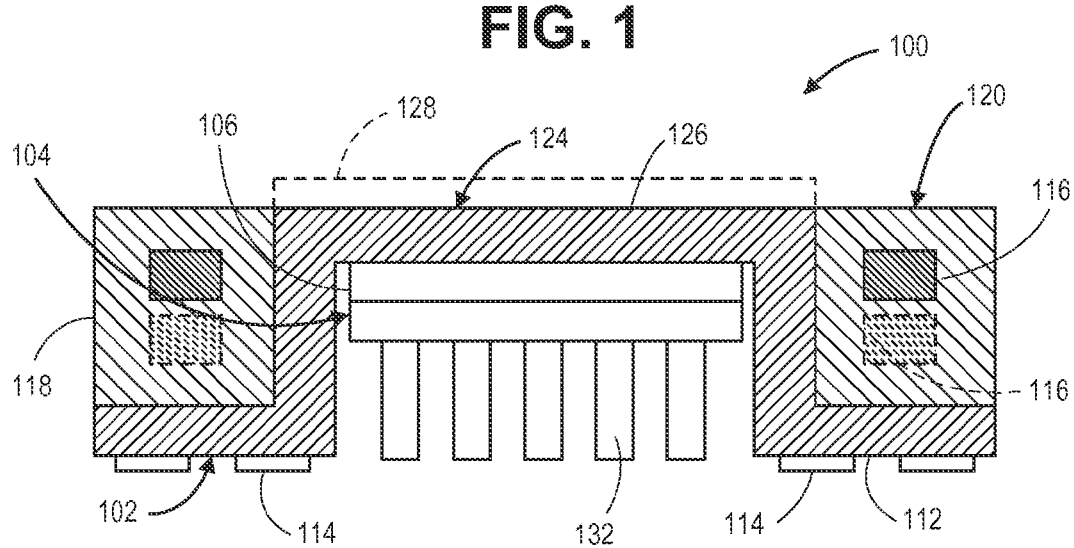
FIG. 2 is a diagrammatic partial cross-sectional side elevation view illustrating an integrated circuit device including a support, an integrated circuit, and a magnetic portion wrapped around the integrated circuit, where the support is implemented as a lead-frame for supporting the integrated circuit and the magnetic portion in accordance with an example implementation of the present disclosure.
Figure 3:
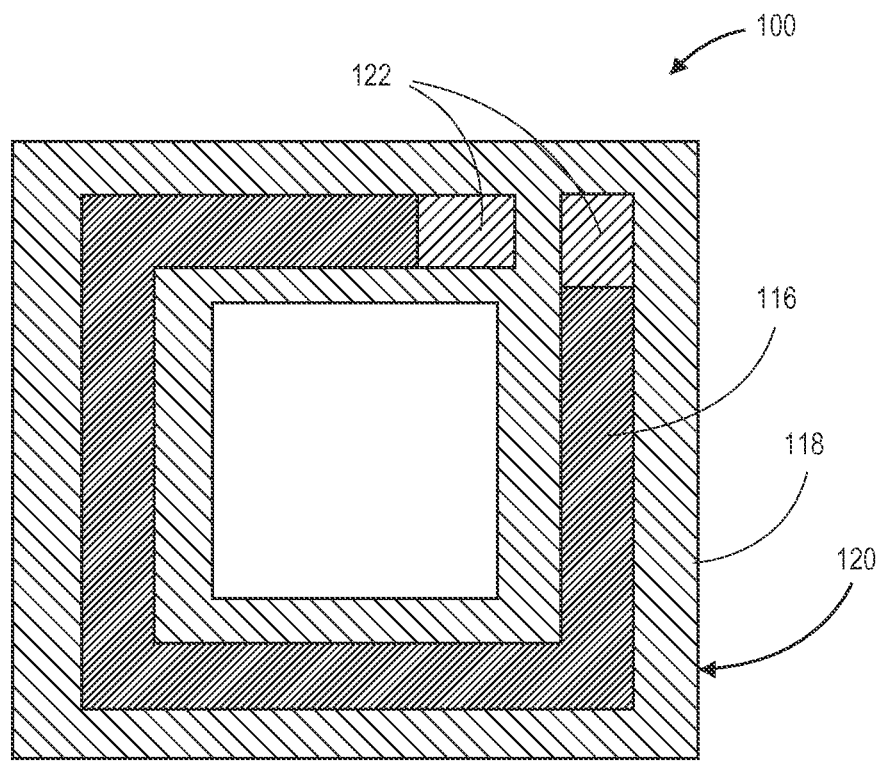
FIG. 3 is a diagrammatic bottom plan view of the magnetic portion illustrated in FIG. 2.
Figure 4:
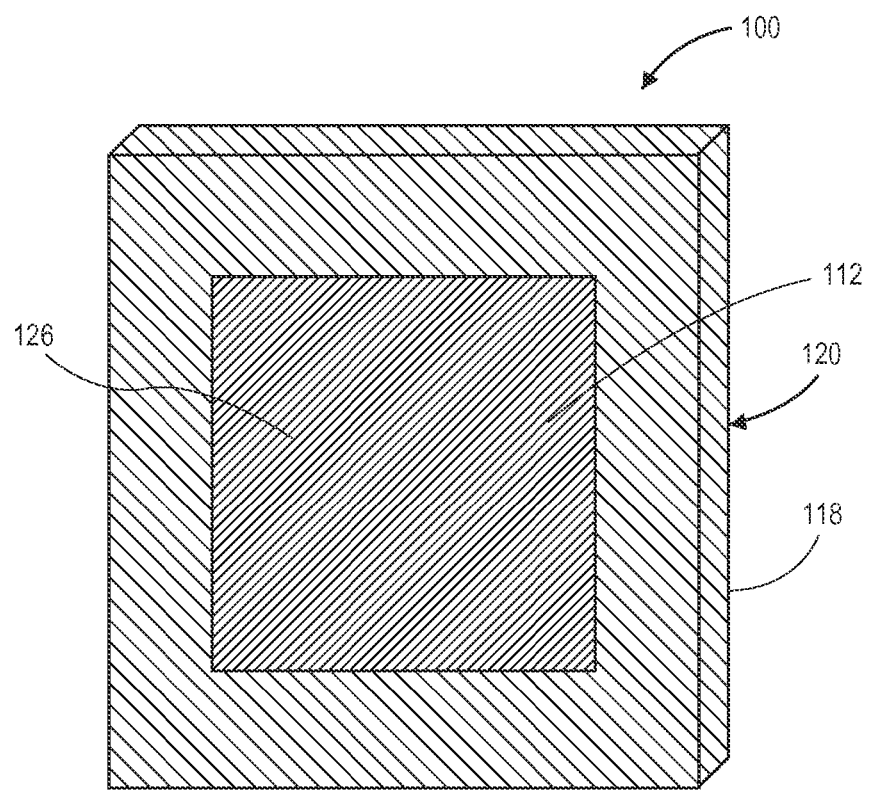
FIG. 4 is a diagrammatic partial top plan view of the integrated circuit device illustrated in FIG. 2.
Figure 5:
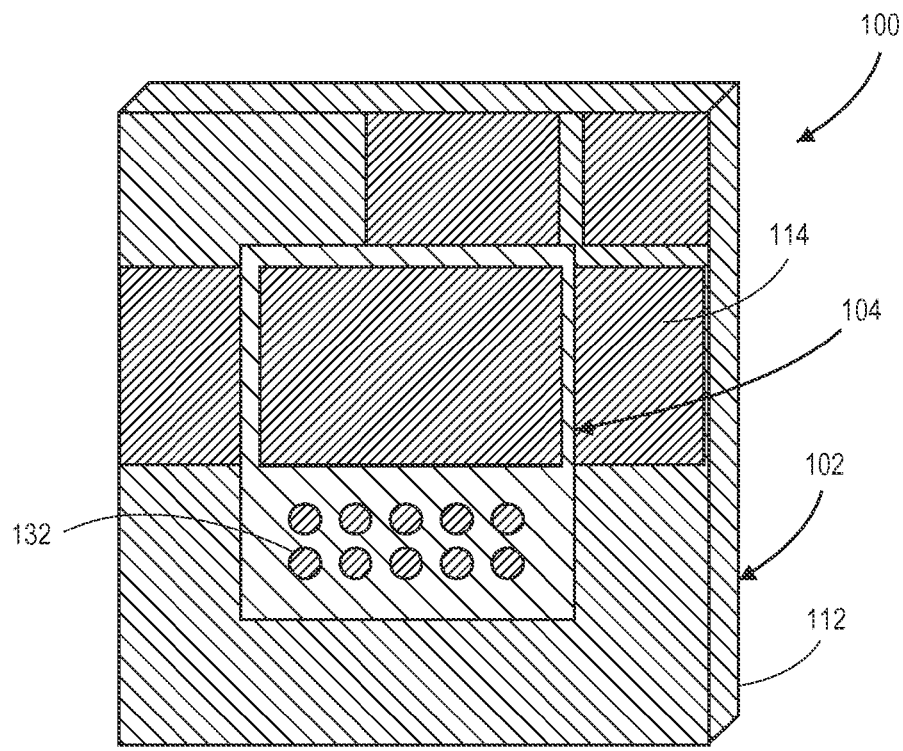
FIG. 5 is a diagrammatic partial bottom plan view of the integrated circuit device illustrated in FIG. 2.

The encapsulating structure 124 may be used to enhance the ability of the integrated circuit device 100 to remove heat from the power converter circuitry of the integrated circuit 104/magnetic portion 120 and dissipate that heat in the air without being primarily conducted and heating other components of the integrated circuit device 100, such as components on a circuit board 110 of the integrated circuit device 100. For example, the encapsulating structure 124 can include a topside thermal interface 126 formed from a thermally conductive material. In some implementations, the encapsulating structure 124 forms the thermal interface 126, acting as a heat sink for the power converter circuitry. In other implementations, the thermal interface 126 provides thermal connectivity to an external heat-sink 128. For example, in one configuration, the lead-frame 112 can be used as a heat-sink, or to provide an interface for an external heat-sink 128 mounted on a top surface of the lead-frame 112 (e.g., as illustrated in FIG. 2). In another configuration, metal encapsulating material can be used as a heat-sink (e.g., as illustrated in FIGS. 6, and 12 through 15), or to provide an interface for an external heat-sink 128 (e.g., as illustrated in FIG. 6). Further, a thermal compound 130 can be used to enhance the thermal connectivity between the metal encapsulating material and the integrated circuit 104.

The integrated circuit 104 and/or the magnetic portion 120 may be elevated some distance from a circuit board 110 of the integrated circuit device 100. In implementations, the integrated circuit 104 and/or the magnetic portion 120 can be elevated between about two millimeters and four millimeters (2 mm-4 mm) from a PCB. For example, in a configuration using a lead-frame 112, the lead-frame 112 may be constructed to elevate the integrated circuit 104 relative to a plane defined by a bottom surface of the lead-frame 112 (e.g., as illustrated in FIG. 2). In other configurations, the integrated circuit 104 may be elevated with respect to the lead-frame 112 or the substrate 106 (e.g., as illustrated in FIGS. 14 and 15). In some configurations, the elevated integrated circuit 104 may include electrical connections for coupling the integrated circuit 104 to the circuit board 110. These connections may be used to bring power/signals out of the integrated circuit 104 and/or to supply power/signals to the integrated circuit 104. For example, the integrated circuit 104 may include copper pillars 132 grown from semiconductor material (e.g., silicon) of the integrated circuit 104. The separation of the integrated circuit 104 from the circuit board 110 (e.g., the height of the copper pillars 132) can be determined by the thermal performance of the integrated circuit 104 and/or the magnetic portion 120 power conversion circuitry. While the present disclosure has mentioned the copper pillars 132 for example purposes, it should be noted that the integrated circuit 104 can be connected to the circuit board 110 using bond wires, and other various types of electrical connection hardware.

Example Fabrication Process

The following discussion describes example techniques for fabricating an integrated circuit device that includes a magnetic portion attached to a support around an integrated circuit. FIG. 16 depicts a process 1600, in an example implementation, for fabricating an integrated circuit device, such as the example integrated circuit devices 100 illustrated in FIGS. 1 through 15 and described above. In the process 1600 illustrated, a support is formed for supporting electrical circuitry (Block 1610). For example, with reference to the integrated circuit devices 100 described above, the support 102 may be formed using a substrate 106 fabricated from a wafer, such as a silicon wafer (e.g., p-type wafer, n-type wafer, or the like), that includes one or more integrated circuits formed therein. While the accompanying figures describe a support 102 having one monolithic substrate 106 for illustration purposes, it should be noted that more than one substrate 106 may be used with an integrated circuit device 100 in accordance with the present disclosure. For example, the support 102 may include two or more dies/substrates 106 stacked in one multi-chip package. In this type of implementation, an integrated circuit device 100 may comprise a System in Package (SiP) or a three-dimensional (3-D) integrated circuit. Additionally, the support 102 may include multiple dies combined on a small substrate in the form of a Multi-Chip Module (MCM), or the like.

In some configurations, the support 102 may be formed as a lead-frame 112 for attaching an integrated circuit 104 having electrical circuitry formed on one or more dies, such as substrate 106 (e.g., as previously described). For example, a lead-frame 112 can be formed from a metal alloy material having a die paddle, to which a die/substrate 106 or MCM is attached. In some implementations, the lead-frame 112 can be formed from flat sheet metal using stamping or etching, and finished with processing steps including cleaning, silver-plating to improve wirebond and die attach quality, taping to prevent lead deformation, and/or downsetting to push the die paddle down relative to bonding fingers of the lead-frame 112. In implementations, the lead-frame 112 material is selected to provide characteristics to facilitate connection to the integrated circuit 104, such as good adherence to the molding compound used to attach a die/substrate 106 to the die paddle, and/or a coefficient of thermal expansion similar to those of the die/substrate 106 and the molding compound. Further, the lead-frame 112 material can be selected to provide other characteristics, such as high strength, good formability, high electrical conductivity, and/or high thermal conductivity. The lead-frame 112 includes leads 114 (terminations) for external electrical connections (e.g., for connecting to other electronic components of the integrated circuit 104 via, for example, a circuit board 110). Leads 114 for the lead-frame 112 can be positioned in various ways, and can include terminations on a top surface of the lead-frame 112 and/or a bottom surface of the lead-frame 112. The one or more dies/substrates 106 can be connected to the leads 114 by wires using, for instance, wire bonding and/or tape automated bonds.

An integrated circuit having electrical circuitry disposed of the support is then formed (Block 1620). For instance, with continuing reference to the semiconductor devices 100 described above, integrated circuits may be formed using suitable semiconductor formation techniques, such as deposition, etching, annealing, photolithography, and so forth. The integrated circuit 104 may be configured in a variety of ways. For example, the integrated circuits may be comprised of digital circuit technology, analog circuit technology, mixed-signal technology, and so forth. The integrated circuits may be connected to one or more conductive layers, such as contact pads, or the like, deployed over a substrate 106. These conductive layers provide electrical contacts through which the integrated circuits are interconnected to other components associated with the integrated circuit devices 100 (e.g., printed circuit boards, etc.). The number and configuration of conductive layers (e.g., contact pads) may vary depending on the complexity and configuration of the integrated circuits, the size and shape of the integrated circuit chip, and so forth. The substrate 106 may further include one or more protective layers (e.g., passivation layers, dielectric layers, etc.) formed over the integrated circuit 104 to provide protection to the integrated circuits during manufacturing and use. The protective layers may comprise various materials, such as benzocyclobutene polymer (BCB), silicon dioxide ($SiO_2$), and so forth. In implementations, the substrate 106 includes external electrical connections, such as stud/pad/solder-ball connections 108 (e.g., for connecting to other electronic components of the integrated circuit 104 via, for example, a circuit board 110).

A magnetic portion may be formed around the integrated circuit (Block 1630). For example, with continuing reference to the semiconductor devices 100 described above, the integrated circuit device 100 includes one or more windings 116 at least partially surrounding the integrated circuit 104. The windings 116 are formed from conductive material wound around or embedded inside a core material 118 to form a wrap-around magnetic portion 120, such as for an inductor or a power transformer. Then, the integrated circuit and the magnetic portion are interconnected for converting power input signals to power output signals (Block 1640). For instance, with continuing reference to the semiconductor devices 100 described above, the windings 116 are connected to the integrated circuit 104 to provide power conversion functionality. For example, in the case of a configuration using a lead-frame 112, the windings 116 may be connected to the integrated circuit 104 via terminals 122 connected to the lead-frame 112, providing low-resistance connectivity to the magnetic portion 120 and low interconnectivity losses between the magnetic portion 120 and the integrated circuit 104. In other instances, the windings 116 may be connected to the integrated circuit 104 via the substrate 106.

In some implementations, the integrated circuit and/or the magnetic portion may be fully or partially encapsulated (Block 1650). For example, with continuing reference to the semiconductor devices 100 described above, the integrated circuit device 100 may include an encapsulating structure 124. The encapsulating structure 124 can be used for separating the integrated circuit 104 and/or the magnetic portion 120 from other electronic components of the integrated circuit device 100. For example, the encapsulating structure 124 can be used to reduce electrical interference to the integrated circuit 104. The encapsulating structure 124 may be used to provide electromagnetic/electrostatic shielding between the integrated circuit 104/magnetic portion 120 and other electronic components of the integrated circuit device 100. The encapsulating structure 124 may be used to enhance the ability of the integrated circuit device 100 to remove heat from the power converter circuitry of the integrated circuit 104/magnetic portion 120 and dissipate that heat in the air without being primarily conducted and heating other components of the integrated circuit device 100, such as components on a circuit board 110 of the integrated circuit device 100.

Conclusion

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. An integrated circuit device comprising:
a support for supporting electrical circuitry;
an integrated circuit having electrical circuitry disposed on the support; and
a magnetic portion attached to the support and wrapped around the periphery of the integrated circuit, the integrated circuit and the magnetic portion interconnected for converting a power input signal having a first characteristic to a power output signal having a second characteristic different from the first characteristic, wherein the support comprises a projection separating the magnetic portion from the integrated circuit and disposed between the integrated circuit and the magnetic portion along the entirety of the periphery of the integrated circuit that shields the integrated circuit from the magnetic portion.

2. The integrated circuit device as recited in claim 1, further comprising:
an encapsulating structure for at least partially encapsulating at least one of the integrated circuit or the magnetic portion.

3. The integrated circuit device as recited in claim 2, wherein the encapsulating structure shields at least one of the integrated circuit or the magnetic portion.

4. The integrated circuit device as recited in claim 2, wherein the encapsulating structure comprises a thermal interface thermally coupled with at least one of the integrated circuit or the magnetic portion, the encapsulating structure for transferring heat away from the at least one of the integrated circuit or the magnetic portion.

5. The integrated circuit device as recited in claim 4, further comprising:
a heat-sink thermally coupled with the encapsulating structure.

6. The integrated circuit device as recited in claim 2, wherein the encapsulating structure comprises a lead-frame and the integrated circuit is disposed on a die attached to the lead-frame.

7. The integrated circuit device as recited in claim 1, wherein the integrated circuit is elevated from a bottom surface of the support.

8. The integrated circuit device as recited in claim 7, further comprising:
a copper pillar extending from the integrated circuit for coupling the integrated circuit to a circuit board.

9. A process comprising:
forming a support for supporting electrical circuitry;
forming an integrated circuit having electrical circuitry disposed on the support;
wrapping a magnetic portion around the periphery of the integrated circuit; and
interconnecting the integrated circuit and the magnetic portion for converting a power input signal having a first characteristic to a power output signal having a second characteristic different from the first characteristic, wherein the support comprises a projection separating the magnetic portion from the integrated circuit and disposed between the integrated circuit and the magnetic portion along the entirety of the periphery of the integrated circuit that shields the integrated circuit from the magnetic portion.

10. The process as recited in claim 9, further comprising:
forming an encapsulating structure for at least partially encapsulating at least one of the integrated circuit or the magnetic portion.

11. The process as recited in claim 10, wherein the encapsulating structure shields at least one of the integrated circuit or the magnetic portion.

12. The process as recited in claim 10, wherein the encapsulating structure comprises a thermal interface thermally coupled with at least one of the integrated circuit or the magnetic portion, the encapsulating structure for transferring heat away from the at least one of the integrated circuit or the magnetic portion.

13. The process as recited in claim 12, further comprising:
coupling a heat-sink with the encapsulating structure.

14. The process as recited in claim 10, wherein the encapsulating structure comprises a lead-frame and the integrated circuit is disposed on a die attached to the lead-frame.

15. The process as recited in claim 9, wherein the integrated circuit is elevated from a bottom surface of the support.

16. The process as recited in claim 15, further comprising:
forming a copper pillar extending from the integrated circuit for coupling the integrated circuit to a circuit board.

17. An integrated circuit device comprising:
a lead-frame having a thermal interface;
an integrated circuit having electrical circuitry disposed on a die attached to the lead-frame and coupled to the thermal interface of the lead-frame; and
a winding of conductive material attached to the lead-frame and wrapped around the periphery of the die, the integrated circuit and the winding of conductive material interconnected for converting a power input signal having a first characteristic to a power output signal having a second characteristic different from the first characteristic, wherein the lead-frame comprises a projection separating the winding of conductive material from the integrated circuit and disposed between the integrated circuit and the winding of conductive material along the entirety of the periphery of the integrated circuit that shields the integrated circuit from the winding of conductive material.

18. The integrated circuit device as recited in claim 17, further comprising:
a heat-sink coupled with the thermal interface.

19. The integrated circuit device as recited in claim 17, wherein the integrated circuit is elevated from a bottom surface of the lead-frame.

20. The integrated circuit device as recited in claim 19, further comprising:
a copper pillar extending from the integrated circuit for coupling the integrated circuit to a circuit board.

* * * * *